US012745578B2

(12) United States Patent
Liao et al.

(10) Patent No.: US 12,745,578 B2
(45) Date of Patent: Sep. 22, 2026

(54) ION IMPLANTATION FOR INCREASED ADHESION WITH RESIST MATERIAL

(71) Applicant: Applied Materials, Inc., Santa Clara, CA (US)

(72) Inventors: Lei Liao, San Jose, CA (US); Yichuan Ling, Fremont, CA (US); Zhiyu Huang, Sunnyvale, CA (US); Hideyuki Kanzawa, Halfmoon, NY (US); Fenglin Wang, Lexington, MA (US); Rajesh Prasad, Lexington, MA (US); Yung-Chen Lin, Gardena, CA (US); Chi-I Lang, Cupertino, CA (US); Ho-yung David Hwang, Cupertino, CA (US); Lequn Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 395 days.

(21) Appl. No.: 18/232,916

(22) Filed: Aug. 11, 2023

(65) Prior Publication Data

US 2024/0071773 A1 Feb. 29, 2024

Related U.S. Application Data

(60) Provisional application No. 63/401,260, filed on Aug. 26, 2022.

(51) Int. Cl.
*H10P 14/00* (2026.01)
*H10P 14/69* (2026.01)
(Continued)

(52) U.S. Cl.
CPC .......... *H10P 30/40* (2026.01); *H10P 14/6905* (2026.01); *H10P 14/69215* (2026.01); *H10P 14/6927* (2026.01)

(58) Field of Classification Search
CPC ........... H01L 21/31155; H01L 21/3115; H10P 30/40; H10P 50/73; H10P 14/6905; H10P 14/69215; H10P 14/6927
See application file for complete search history.

(56) References Cited

U.S. PATENT DOCUMENTS 5,310,621 A 5/1994 Sayka
6,399,513 B1 * 6/2002 Murphy ............ H01L 21/67051 257/E21.255
(Continued)

FOREIGN PATENT DOCUMENTS

JP 2006066749 A 3/2006
TW 201443109 A 11/2014
(Continued)

OTHER PUBLICATIONS

Application No. PCT/US2023/071485 , International Search Report and the Written Opinion, Mailed On Nov. 21, 2023, 10 pages.
(Continued)

*Primary Examiner* — Reema Patel
(74) *Attorney, Agent, or Firm* — Kilpatrick Townsend & Stockton LLP

(57) ABSTRACT

Exemplary methods of semiconductor processing may include forming a layer of silicon-containing material on a semiconductor substrate. The methods may include performing a post-formation treatment on the layer of silicon-containing material to yield a treated layer of silicon-containing material. The methods may include contacting the treated layer of silicon-containing material with an adhesion agent. The methods may include forming a layer of a resist material on the treated layer of silicon-containing material.

20 Claims, 5 Drawing Sheets

(51) Int. Cl.
*H10P 14/692* (2026.01)
*H10P 30/40* (2026.01)

(56) References Cited

U.S. PATENT DOCUMENTS

| | | | | |
|---|---|---|---|---|
| 2004/0202964 | A1 | 10/2004 | Wu et al. | |
| 2014/0037858 | A1 | 2/2014 | Ma et al. | |
| 2015/0270144 | A1* | 9/2015 | Chou | H01L 21/0337 438/703 |
| 2017/0178900 | A1* | 6/2017 | Chen | C23C 14/54 |
| 2019/0187556 | A1 | 6/2019 | Park et al. | |
| 2020/0090936 | A1* | 3/2020 | Glodde | G03F 7/16 |

FOREIGN PATENT DOCUMENTS

| | | | |
|---|---|---|---|
| TW | 201729288 | A | 8/2017 |
| WO | 0121691 | A1 | 3/2001 |
| WO | 2021262371 | A1 | 12/2021 |

OTHER PUBLICATIONS

Application No. TW112131883 , Office Action, Mailed On Dec. 16, 2024, 6 pages.

Search Report for Taiwan Invention Patent Application No. 112131883 dated Jun. 11, 2014, 8 pages.

Office Action for Taiwan Invention Patent Application No. 112131883 dated Oct. 11, 2024, 7 pages.

* cited by examiner

ION IMPLANTATION FOR INCREASED ADHESION WITH RESIST MATERIAL

CROSS-REFERENCE TO RELATED APPLICATIONS

This application claims the benefit of, and priority to U.S. Provisional Application Ser. No. 63/401,260, filed Aug. 26, 2022, which is hereby incorporated by reference in its entirety for all purposes.

TECHNICAL FIELD

The present technology relates to methods and systems for semiconductor processing. More specifically, the present technology relates to systems and methods for treating a layer of material to increase adhesion with a resist material.

BACKGROUND

Integrated circuits are made possible by processes which produce intricately patterned material layers on substrate surfaces. Producing patterned material on a substrate requires controlled methods for forming and removing material. As device sizes continue to reduce, film characteristics may lead to larger impacts on device performance. Materials used to form layers of materials may affect operational characteristics of the devices produced. As material thicknesses continue to reduce, as-deposited characteristics of the films may have a greater impact on device performance.

Thus, there is a need for improved systems and methods that can be used to produce high quality devices and structures. These and other needs are addressed by the present technology.

SUMMARY

Exemplary methods of semiconductor processing may include forming a layer of silicon-containing material on a semiconductor substrate. The methods may include performing a post-formation treatment on the layer of silicon-containing material to yield a treated layer of silicon-containing material. The methods may include contacting the treated layer of silicon-containing material with an adhesion agent. The methods may include forming a layer of a resist material on the treated layer of silicon-containing material.

In some embodiments, the layer of silicon-containing material may be a silicon-containing anti-reflective coating, a spin-on glass, silicon oxynitride, or silicon carbonitride. The spin-on glass may be doped silicon dioxide. The doped silicon dioxide may include boron or phosphorous. A surface of the layer of silicon-containing material may be hydrophilic prior to the post-formation treatment. A surface of the treated layer of silicon-containing material may be hydrophobic after contacting the treated layer of silicon-containing material with the adhesion agent. A surface of the layer of silicon-containing material may be characterized by Si—OH bonding prior to the post-formation treatment. The post-formation treatment may be or include an ion implantation process. The ion implantation process may be performed with ions of one or more elements from Group III through Group VIII. The ion implantation process may be performed with ions of fluorine or xenon.

Embodiments of the present technology encompass semiconductor processing methods. The methods may include forming a layer of silicon-containing material on a semiconductor substrate. The methods may include performing an ion implantation treatment on the layer of silicon-containing material to yield a treated layer of silicon-containing material. The methods may include contacting the treated layer of silicon-containing material with an adhesion agent. The methods may include forming a layer of resist material on the treated layer of silicon-containing material.

In some embodiments, the adhesion agent may be or include hexamethyldisilazane. The ion implantation treatment may be or include a beamline ion implantation process or a plasma doping process. The ion implantation treatment may include a beamline ion implantation process. The beamline ion implantation process may be performed at an energy of less than or about 2.5 keV. An implant dose may be characterized by less than or about 1 $e^{14}$ ions/$cm^2$ to about 5 $e^{16}$ ions/$cm^2$. The methods may include patterning the layer of resist material. A patterned layer of resist material may include resist lines characterized by a pitch of less than or about 40 nm.

Embodiments of the present technology encompass semiconductor processing methods. The methods may include forming a layer of silicon-containing material on a semiconductor substrate. The layer of silicon-containing material may be spin-on glass. The methods may include performing an ion implantation treatment on the layer of silicon-containing material to yield a treated layer of silicon-containing material. The methods may include contacting the treated layer of silicon-containing material with an adhesion agent. The adhesion agent may include a silazane group. The methods may include forming a layer of resist material on the treated layer of silicon-containing material. The methods may include patterning the layer of resist material.

In some embodiments, the ion implantation treatment breaks Si—OH bonds present in the layer of silicon-containing material. The adhesion agent may be or include hexamethyldisilazane. A surface of the treated layer of silicon-containing material may be characterized by Si—O—$Si(CH_3)_3$ bonding after being contacted with the adhesion agent. A surface of the treated layer of silicon-containing material may be hydrophobic after being contacted with the adhesion agent. Patterning the layer of resist material may form resist lines characterized by a pitch of less than or about 40 nm. The resist lines may remain adhered to the treated layer of silicon-containing material.

Such technology may provide numerous benefits over conventional systems and techniques. For example, embodiments of the present technology may produce films characterized by increased hydrophobicity. Additionally, the present technology may weaken and/or break Si—OH bonds in the films. The increased hydrophobicity and/or weakened Si—OH bonds in the films may increase adhesion between the films and a subsequently formed resist material, which may be formed after treating the surface of the films with an adhesion agent. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
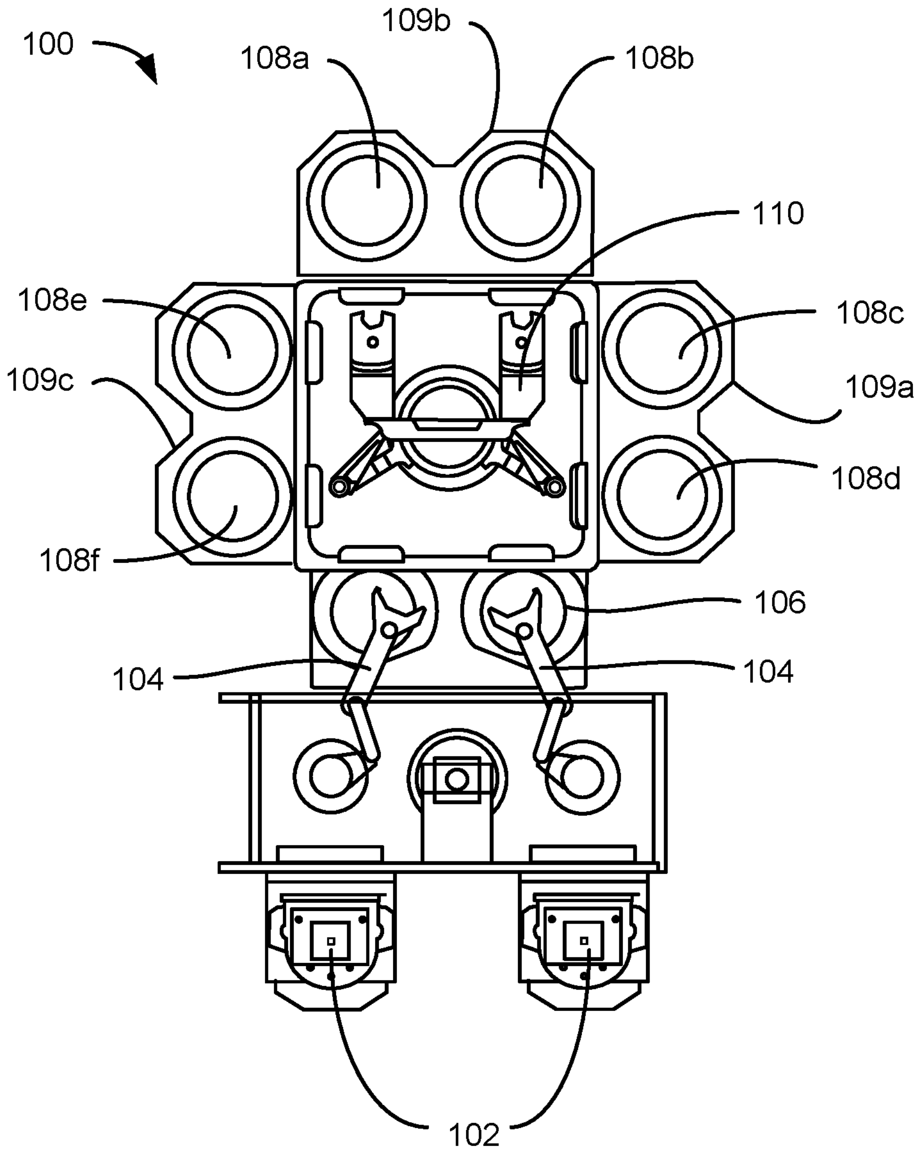
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As semiconductor device sizes continue to reduce, the constituent films included within a structure may affect device performance, as well as fabrication of other materials being included in the device. Additionally, as demand increases, throughput and queue times become a point of emphasis. Thus, a demand exists for high-quality materials and structures that may be formed both quickly and efficiently. However, in processes to form resist materials with reduced critical dimension or pitch size, adhesion between the resist materials and the underlying materials may not be sufficient to adhere the resist material to the underlying materials. The uniformity, or non-uniformity due to poor adhesion of the resist material, may propagate to underlying or overlying materials during subsequent etch or formation processes.

To increase adhesion between the underlying materials and the resist materials, conventional technologies may treat the underlying materials with a material to modify surfaces of the underlying materials. For example, the surfaces of the underlying materials may be treated with hexamethyldisilazane. Although these techniques may increase adhesion, the reduction in device sizes has complicated the adhesion between the underlying materials and the resist materials.

The present technology overcomes these issues by performing an ion implantation process to reorganize constituent bonds and smooth the underlying materials. By implanting ions with sufficient energy, surface bonding in the underlying materials may be reorganized. The modification in surface bonding may increase the effect of the treatment with hexamethyldisilazane, which may allow an even higher adhesion between the underlying materials and the resist materials. Additionally, by utilizing particular ion implantation techniques, or by adjusting ion dosing, sputtering and non-desirable material affects of the underlying materials may be limited.

Although the remaining disclosure will routinely identify specific deposition processes and post-formation processes utilizing the disclosed technology, it will be readily understood that the systems and methods are equally applicable to other deposition and post-formation processes as may occur in the described chambers or any other chamber. Accordingly, the technology should not be considered to be so limited as for use with these specific deposition processes or chambers alone. The disclosure will discuss one set of possible chambers that may be used to perform processes according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
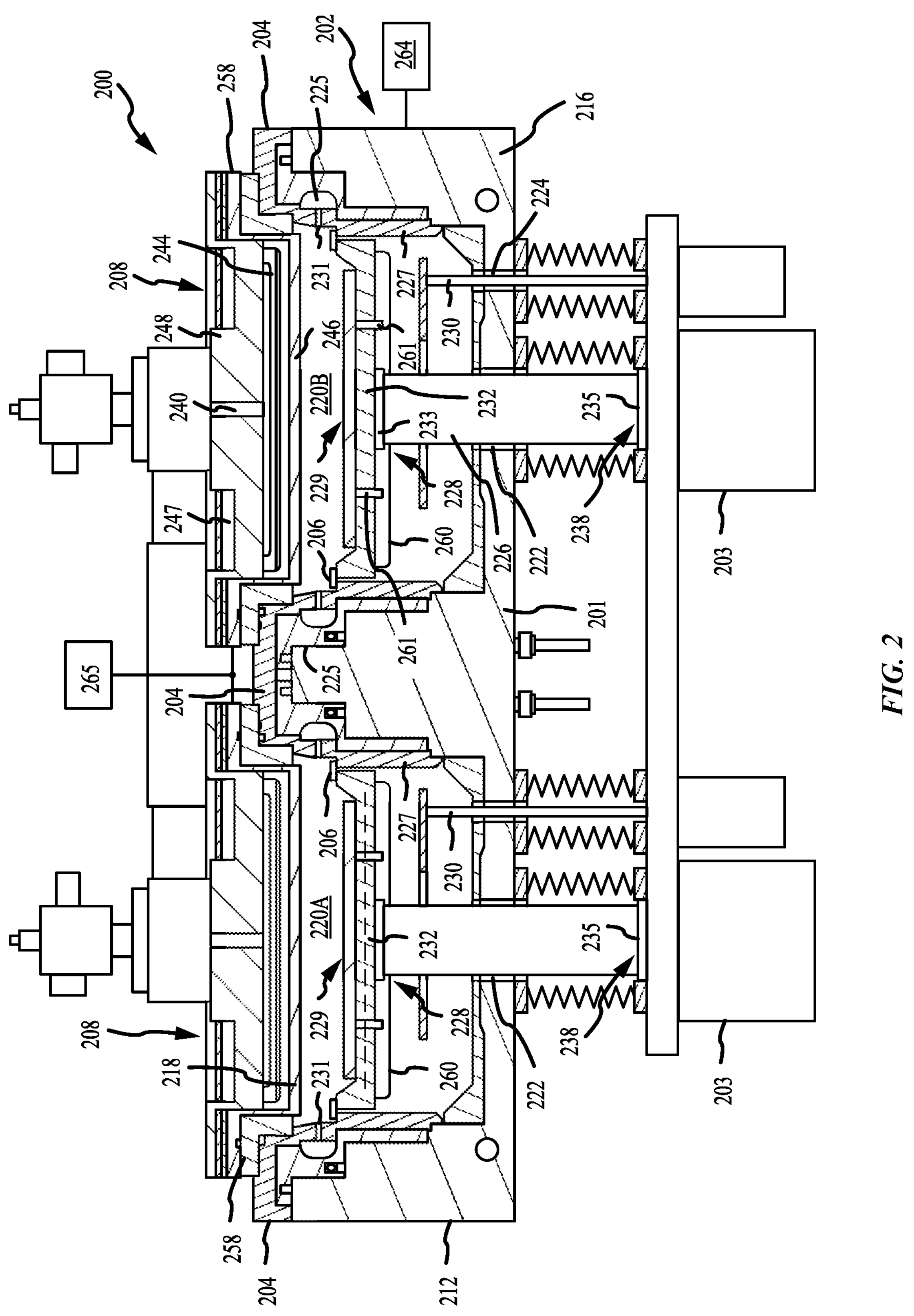
FIG. 2 shows a schematic cross-sectional view of an exemplary plasma deposition system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
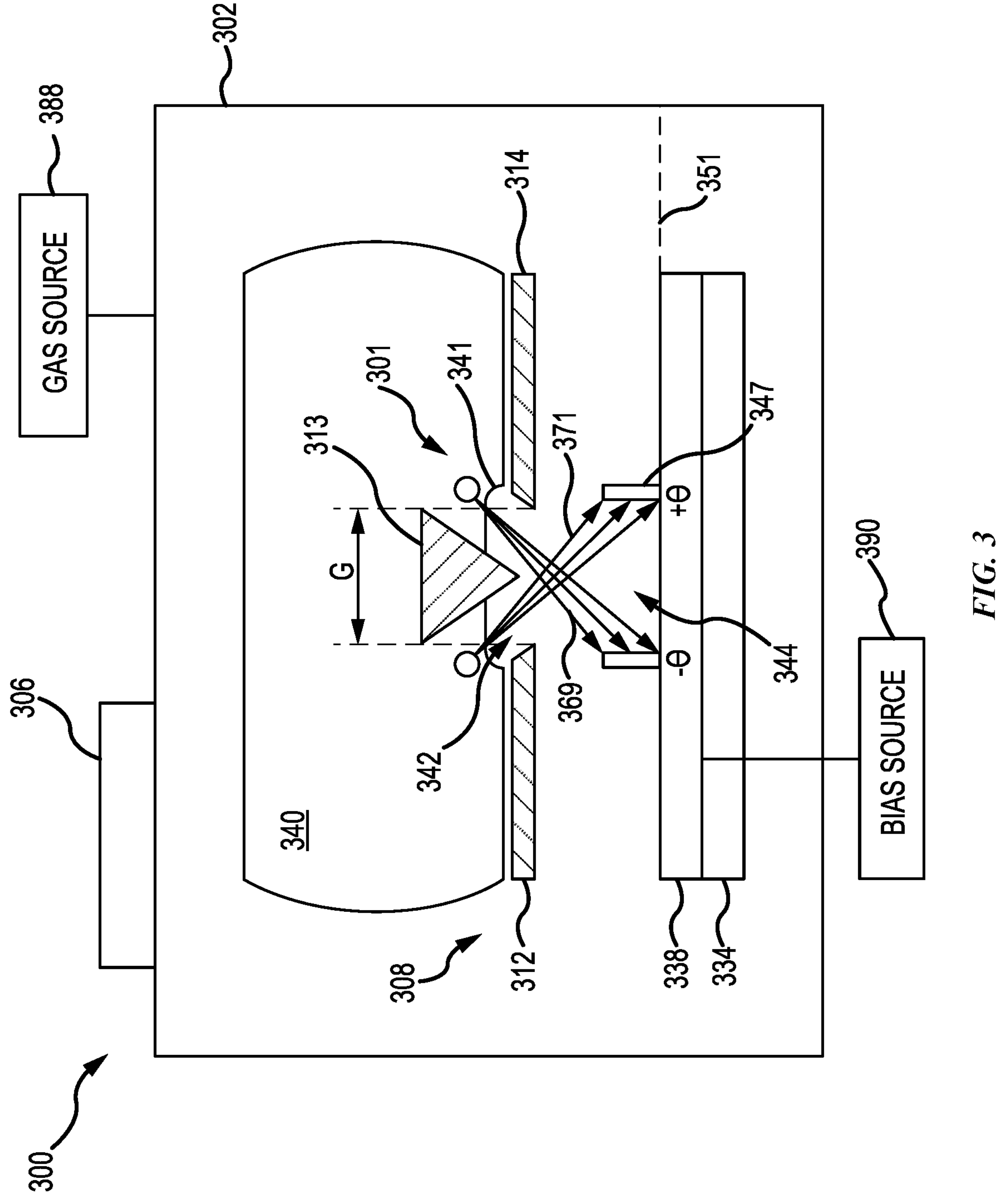
FIG. 3 shows a schematic cross-sectional view of an exemplary ion implant system according to some embodiments of the present technology.

FIG. 3 shows a schematic cross-sectional view of an exemplary ion implant system 300 according to some embodiments of the present technology. System 300 may be utilized to implant electrons or ions into a film layer that may alter characteristics of the film layer, such as to break bonds within the film and allow hydrogen to be released from formed layers on a substrate. It is to be understood that system 300 is merely one example of a beamline ion implantation chamber that may be used in some embodiments of the present technology. Any number of other chambers may be utilized in embodiments of the present technology that may allow ion implantation to occur, including plasma doping chambers, or other implantation systems. For example, ion implant system 300 is only one example of an apparatus that may be used. In embodiments of the present technology, traditional plasma processing apparatuses may be used, pattern beams, electron beams that may be pulsed or continuous, raster scanning, variable scanning, and any other method of implanting ions or electrons may be used. According to certain aspects, one or more energetic particle beams may include a cylindrical shaped beam, a plurality of adjacent or overlapping cylindrical beams, or a ribbon shaped beam including a continuous rectangular shaped beam. The one or more energetic particle beams may be moved relative to the substrate during processing and/or the substrate can be moved relative to the energetic particle beam during processing.

The plasma processing system 300 may include a process chamber 302, a platen 334, a source 306, and a modifying element 308. The platen 334 may be positioned in the processing chamber 302 for supporting a substrate 338. The platen 334 may be coupled with an actuator, which may allow the platen 334 to moved or translated in one or more horizontal and/or vertical directions during a scanning motion. The scanning motion may be performed within a single horizontal plane which may be substantially parallel to the modifying element 308. The source 306 may be configured to generate a plasma 340 in the process chamber 302. The modifying element 308 may include a pair of insulators 312, 314 which may define a gap between the insulators and having a horizontal spacing G. The insulators 312, 314 may be or include any number of insulating materials, or semi-conducting materials. In some embodiments the elements may alternatively be a conductive material. The modifying element may also include a directional element 313 disposed in a position relative to the insulators 312, 314 such that ions 301 may be directed toward the substrate 338.

In operation, a gas source 388 may supply an ionizable gas to the process chamber 302. Examples of an ionizable gases may be or include any number of precursors including one or more constituent elements or ions. For example, precursors may include any material or materials which may be ionized to produce one or more ions including, alone or in combination, helium, hydrogen, neon, argon, krypton, fluorine, carbon, boron, nitrogen, or any other element or combination of elements. The source 306 may generate the plasma 340 by exciting and ionizing the gas provided to the process chamber 302. The ions 301 may be attracted from the plasma 340 across the plasma sheath 342. For example, a bias source 390 may be configured to bias the substrate 338 to attract the ions 301 from the plasma 340 across the plasma sheath 342. The bias source 390 may be a DC power supply to provide a DC voltage bias signal or an RF power supply to provide an RF bias signal.

The modifying element 308 may modify the electric field within the plasma sheath 342 to control a shape of the boundary 341 between the plasma 340 and the plasma sheath 342. The modifying element 308 may include the insulators 312, 314 and directional element 313 in some embodiments. The insulators 312, 314 and directional element 313 may be fabricated from materials such as quartz, alumina, boron nitride, glass, silicon nitride, or any number of other suitable materials. The boundary 341 between the plasma 340 and the plasma sheath 342 may be dependent on the placement of the directional element 313 relative to the insulators 312, 314 as the directional element 313 may alter the electric field within the plasma sheath 342.

Ions following a trajectory path 371 may strike the substrate 338 at about an angle of +θ normal to the plane 351. Ions following trajectory path 369 may strike the substrate 338 at an angle of about −θ normal to the plane 351. Accordingly, the range of incident angles normal to the plane 351 may be between about +1° and about +65° and between about −1° and about −65°, which may exclude 0° in some embodiments. For example, a first range of incident angles normal to the plane 350 may be between about +5° and about +65° and a second range of incident angles may be between about −5° and about −65°. In some embodiments, the first range of incident angles relative to the plane 351 may be between about −10° and about −20° and the second range of incident angles relative to the plane 351 may be between about +10° and about +20°. In addition, in some embodiments ion trajectories occurring from paths 369 and 371 may cross one another. Depending on a number of factors, which may including the positioning of the directional element 313, a horizontal spacing between the insulators 312, 314, a vertical spacing of the insulators 312, 314 above the plane 351, the dielectric constant of the directional element 313 and the insulators 312, 314, and other plasma processing parameters, the range of incident angles (0), in some embodiments, may be between about +89° and about −89°, which may exclude 0°.

In general, ions provided to a film on the substrate may alter various characteristics of the film. The range of incident angles may be selected based upon an aspect ratio of a 3D feature on the substrate 338. For example, sidewalls 347 of a trench 344, having an exaggerated size for clarity of illustration, may be more uniformly treated by the ions 301 than with conventional plasma processing apparatuses and procedures. The aspect ratio, which may be defined as the relationship between a pitch between the sidewalls 347 and a height of the sidewalls 347 extending from the substrate 338, may determine the angles at which the ions 301 are provided to provide more uniform treatment on the sidewalls 347. For example, a first range of incident angles normal to the plane 351 and adapted to impact the sidewalls 347 may be between about +600 and about +90°, and a second range of incident angles may be between about −60° and about −90°. Any number of different angles may similarly be employed. In some embodiments, angles at which the ions 301 may be provided may be selected to avoid contact with material below the sidewalls 347, for example the substrate 338 or an insulator.

Figure 4:
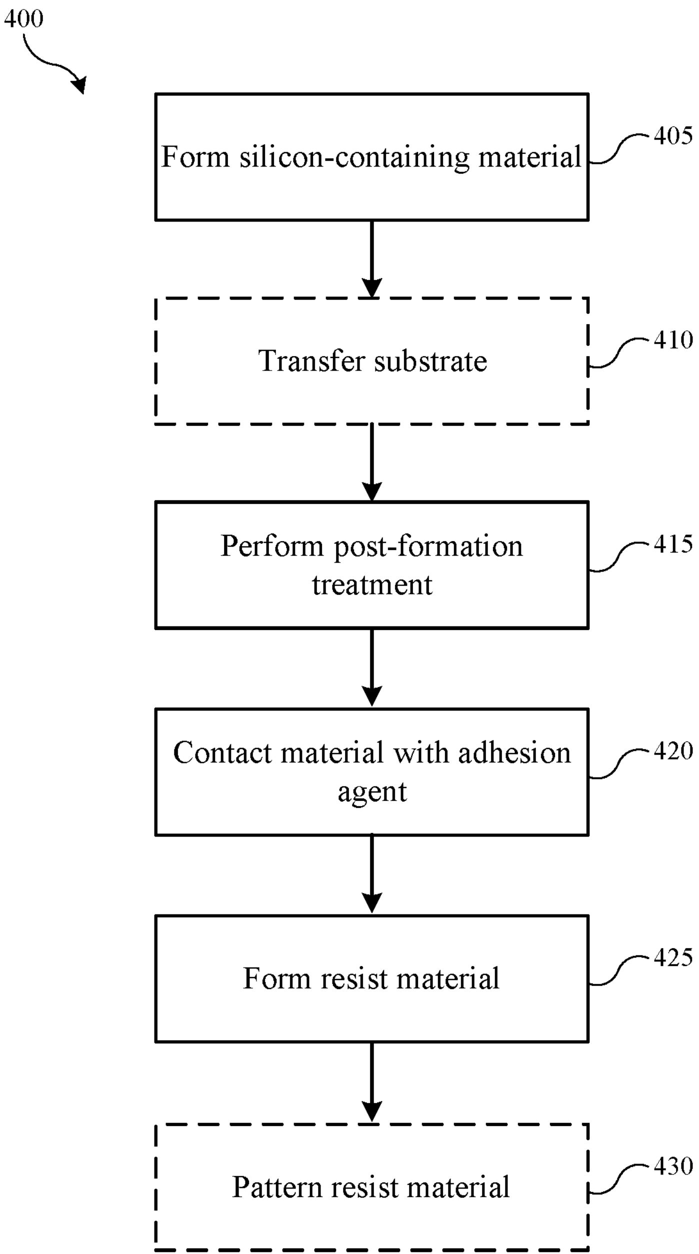
FIG. 4 shows operations in a semiconductor processing method according to some embodiments of the present technology.

FIG. 4 shows exemplary operations in a processing method 400 according to some embodiments of the present technology. The method may be performed in a variety of processing chambers, including processing chambers 200 and or 300 described above. Method 400 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below. It is to be understood that method 400 may be performed on any number of semiconductor structures or substrates, including exemplary structure 500 or substrate 505 as illustrated in FIGS. 5A-5D on which layers of material may be formed. It is to be understood that FIGS. 5A-5D illustrate only partial schematic views, and a substrate may contain any number of structural sections having aspects as illustrated in the figures, as well as alternative structural aspects that may still benefit from operations of the present technology.

Method 400 may involve optional operations to develop the semiconductor structure 500 to a particular fabrication operation. Although in some embodiments method 400 may be performed on a base structure 500, in some embodiments the method may be performed subsequent other material formation or removal. For example, any number of deposition, masking, or removal operations may be performed to produce any transistor, memory, or other structural aspects on a substrate. The substrate may be disposed on a substrate support, which may be positioned within a processing region of a semiconductor processing chamber. The operations may be performed in the same chamber in which aspects of method 400 may be performed, and one or more operations may also be performed in one or more chambers on a similar platform as a chamber in which operations of method 400 may be performed, or on other platforms.

Figure 5A:
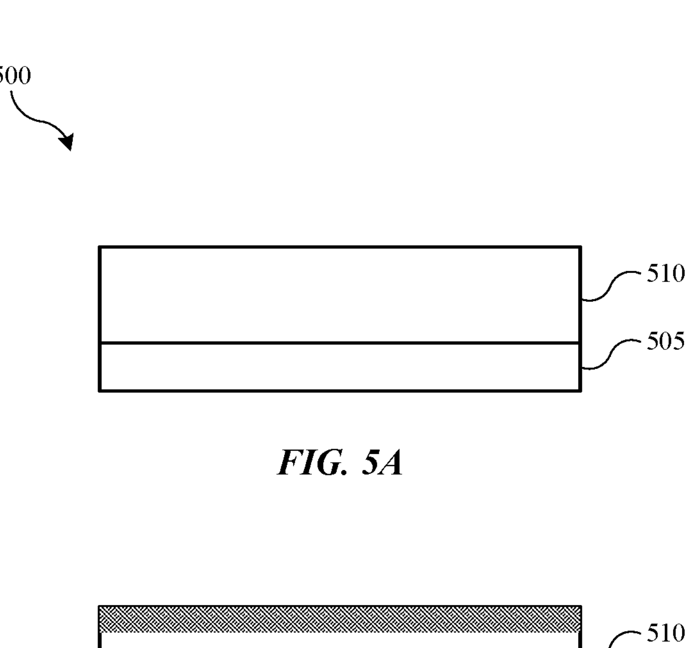
FIGS. 5A-5D show exemplary schematic cross-sectional structures in which material layers are included and produced according to some embodiments of the present technology.

As shown in FIG. 5A, in embodiments, method 400 may include forming a layer of silicon-containing material 510 on a substrate 505 at operation 405. The formation or deposition may be performed using any number of precursors, such as silane or other silicon-containing materials, and in some embodiments a silicon-containing precursor delivered may also include hydrogen or nitrogen. The precursors may also include diatomic nitrogen, ammonia, or other nitrogen-containing materials, diatomic hydrogen or other hydrogen-containing materials, or any other precursors to form a layer of silicon-containing material 510 including carrier gases as well as inert materials. The layer of silicon-containing material 510 may be a silicon-containing anti-reflective coating, a spin-on glass, silicon oxynitride, or silicon carbonitride. In embodiments where the silicon-containing material 510 is a spin-on glass, the spin-on glass may be a doped silicon dioxide. The doped silicon dioxide may include a boron or phosphorous dopant. Consequently, the deposited or formed layer of silicon-containing material 510 may be characterized by a surface of the that is hydrophilic. The presence of Si—OH bonding at the surface of the layer of silicon-containing material 510 may result in the surface being hydrophilic and acidic. It is to be understood that the present technology may not be limited to silicon-containing films, such as spin-on glass. The present technology may also encompass hydrophilicity and/or adhesion management in any number of films formed on semiconductor substrates. Consequently, the silicon-containing material 510 should be considered as only one example film for which the present technology may apply.

The layer of silicon-containing material 510 may be part of any number of structures, which may include thin-film transistor structures in some embodiments. For example, in some embodiments the layer of silicon-containing material 510 may be one of multiple layers in a stack of films formed over a substrate. In some embodiments, the layer of silicon-containing material 510 may be included above another layer of material or between other layers of material, such as other silicon-containing materials or other material layers. In some structures 500, the layer of silicon-containing material 510 may be formed on a layer of material. In embodiments, the layer of silicon-containing material 510 may be characterized by a film thickness of less than or about 500 nm, and may be characterized by a film thickness of less than or about 400 nm, less than or about 350 nm, less than or about 300 nm, less than or about 250 nm, less than or about 200 nm, less than or about 190 nm, less than or about 180 nm, less than or about 170 nm, less than or about 160 nm, less than or about 150 nm, less than or about 140 nm, less than or about 130 nm, less than or about 120 nm, less than or about 110 nm, less than or about 100 nm, less than or about 75 nm, less than or about 50 nm, or less.

As noted previously, some embodiments of the present technology may encompass films formed over materials or structures 500. The underlying materials or structures 500 may be characterized by a thermal budget less than or about 550° C., less than or about 500° C., less than or about 450° C., less than or about 400° C., less than or about 350° C., less than or about 300° C., or less. Accordingly, the layer of silicon-containing material 510 may be formed at or below any of these temperatures in some embodiments to accommodate the underlying materials, and in some embodiments one or more operations, including all operations of method 400, may be performed at or below any of these temperatures, and a substrate being processed may be maintained below or about any of these temperatures throughout processing.

Subsequent film formation, in some embodiments the substrate 505 on which the layer of silicon-containing material 510 was formed may be transferred from a first processing chamber to a second processing chamber at optional operation 410. For example, formation or deposition of the layer of silicon-containing material 510 may be performed in a first chamber, such as chamber 200 or any other deposition chamber in which a silicon-containing material may be deposited. Subsequent deposition, the substrate 505 may be moved to a second chamber for an ion implantation process. The second chamber may be included on the same platform or tool as the first chamber, although in some embodiments the substrate 505 may be moved between tools for an ion implantation process.

Figure 5B:
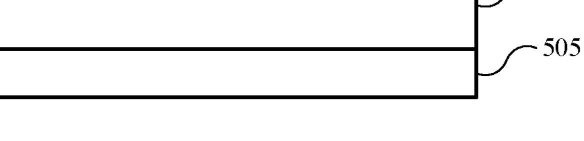

As shown in FIG. 5B, at operation 415, a post-formation treatment, including an ion implantation process, such as beamline ion implantation, may be performed on one or more layers of the substrate 505, including the layer of silicon-containing material 510. Additionally or alternatively, a plasma doping process may be performed at operation 415. Although termed an ion implantation, the process may involve an ion modification in which ion implantation is performed to reorganize the formed film and release materials from the film, and which may include also releasing ions of the ion implantation process. The process may include a beamline ion implantation process, a plasma doping implantation process, or any other implantation as noted previously. The ion implantation process may be performed to modify characteristics of the film. For example, in some embodiments the ion implantation may be performed to reorganize bonds, such as Si—OH bonds, or structure within the material to make the film smoother. With weakened and/or destroyed Si—OH bonds and a smoother film, subsequent surface modification of the film may make the form more hydrophobic. Further, the ion implantation, when performed with fluorine ions, for example, may replace broken Si—OH bonds with Si—F or C—F bonds, which may more readily form hydrogen bonds with subsequently formed resist materials.

The ion implantation process may be performed at low pressure, depending on the process performed. For example, plasma doping ion implantation may be performed at chamber pressures less than or about 100 mTorr, less than or about 10 mTorr, less than or about 1 mTorr, or less. Beamline ion implantation may be performed at much lower pressures, such as less than or about 0.1 mTorr, less than or about 0.05 mTorr, less than or about 0.01 mTorr, or less. These low pressure operations may facilitate transmission of ions through the film structure. Ion implantation processes may be performed at a variety of substrate temperatures, such as from about −150° C. up to or about 550° C. Exemplary ion implantation species, such as beamline ion implantation species, may include materials that modify the Si—OH bonding at the surface of the layer of silicon-containing material 510, such as one or more elements from Group III through Group VIII of the International Union of Pure and Applied Chemistry (IUPAC) Periodic Table, such as boron, aluminum, gallium, indium, carbon, silicon, germanium, tin, nitrogen, phosphorous, arsenic, antimony, oxygen, sulfur, selenium, fluorine, chlorine, helium, neon, argon, krypton, or xenon. In some embodiments, the ion implantation process is performed with ions of fluorine or xenon. In some embodiments, the post-formation treatment, such as a plasma doping treatment, may be performed with precursors of the ions, such as $SiF_4$, $CF_4$, $B_2H_6$, $BF_4$, $AsH_3$, or $PH_3$. The implant energy may be less than about 2.5 keV, with an implant does in the range of from about 1 $e^{14}$ ions/cm$^2$ to 5 $e^{16}$ ions/cm$^2$. At lower energies and dosages, such as less than or about 2.5 keV and less than 5 $e^{16}$ ions/cmz, with fluorine ions as an example, a depth of less than or about 75 Å or less of the layer of silicon-containing material 510 may be modified. By focusing the ion implantation to a depth of less than or about 75 Å of the layer of silicon-containing material 510, the ion implantation may modify only the portion of the layer of silicon-containing material 510 that is necessary to increase adhesion with subsequently formed resist materials. The energy and dose of the process may be controlled to affect an upper portion of the layer of silicon-containing material 510 without and may be limited from more than minimal penetration into underlying structures 500 or portions of the layer of silicon-containing material 510.

The temperature at which the post-formation treatment may be performed may affect the energy of the ions, and in some embodiments a hot ion implantation may be performed. For example, in some embodiments sufficient reorganization may occur at temperatures above or about 200° C., and may occur at temperatures greater than or about 250° C., greater than or about 300° C., greater than or about 350° C., greater than or about 400° C., greater than or about 450° C., or higher, although in some embodiments the ion implantation process may be performed at less than or about any of the thermal budget temperatures described previously. In additional embodiments, a cold ion implant may be performed at temperatures less than or about 50° C., and may occur at temperatures less than or about 25° C., less than or about 0° C., less than or about −25° C., less than or about −50° C., less than or about −75° C., less than or about −100° C., or less. If plasma doping is performed, a doping bias voltage may range from about 100 eV to 5 keV or less. By reducing the bias voltage, a thinner portion of the layer of silicon-containing material 510 may be modified. The plasma doping may be performed in a range of from 1 $e^{15}$ ions/$cm^2$ to 1 $e^{17}$ ions/$cm^2$. Plasma doping may also be performed in a temperature range of from about 25° C. to about 500° C.

An amount of densification may occur of the films based on reformation of bonds through the layer of silicon-containing material 510. Accordingly, in some embodiments a thickness of the layer of silicon-containing material 510 after a post-formation treatment may be less than or about 99% a thickness of the layer of silicon-containing material 510 as-formed. In some embodiments the thickness may be less than or about 98% a thickness of the as-formed layer of silicon-containing material 510, and may be less than or about 97%, less than or about 96%, less than or about 95%, less than or about 94%, less than or about 93%, less than or about 92%, less than or about 91%, less than or about 90%, or less, although a thickness of the layer of silicon-containing material 510 subsequent ion modification may be maintained at greater than or about 80%, greater than or about 85%, greater than or about 87%, greater than or about 90%, greater than or about 92%, greater than or about 95%, or more.

Sputtering may be limited of the film formed as dosing of ion implantation may be controlled relative to other plasma-enhanced processes. For example, in some embodiments, the dosage of ions may be less than or about 5 $e^{16}$ ions/$cm^2$, and may be less than or about 1 $e^{16}$ ions/$cm^2$, less than or about 7 $e^{14}$ ions/$cm^2$, less than or about 5 $e^{14}$ ions/$cm^2$, less than or about 3 $e^{14}$ ions/$cm^2$, less than or about 1 $e^{14}$ ions/$cm^2$, or less. Plasma doping implantation may be characterized by higher dosing than beamline implantation, which may facilitate use with fluorine or xenon, for example, to break bonds and modify the layer of silicon-containing material 510.

At operation 420, the method 400 may include contacting the treated layer of silicon-containing material 510 with an adhesion agent. The adhesion agent may be provided to contact the layer of silicon-containing material 510, which may alter the properties of the material. For example, the layer of silicon-containing material 510 may be contacted with the adhesion agent in a vapor priming operation to modify the surface of the silicon-containing material 510. More specifically, the adhesion agent may be applied in a processing chamber that combines heating of the substrate 505 with exposure to a vapor of the adhesion agent. The adhesion agent may include a silazane, such as hexamethyldisilazane. The adhesion agent may modify the surface of the layer of silicon-containing material 510 to transform the material from a hydrophilic material to a hydrophobic material. When the layer of silicon-containing material 510 is characterized by a hydrophobic surface, adhesion between the silicon-containing material 510 and subsequently formed layer of resist materials may increase. This may be due to the adhesion agent replacing Si—OH bonds with Si—O—Si $(CH_3)_3$ bonds that may more readily bond with layers of resist materials. More specifically, the adhesion agent treatment may add a monolayer of material to the layer of silicon-containing material 510. The —OH groups on the surface of the layer of silicon-containing material 510 may react with methyl groups of the adhesion agent, such as hexamethyldisilazane, which may make the surface more hydrophobic. The surface may then be better matched with the chemistry of the resist material and also less prone to water absorption.

Figure 5C:
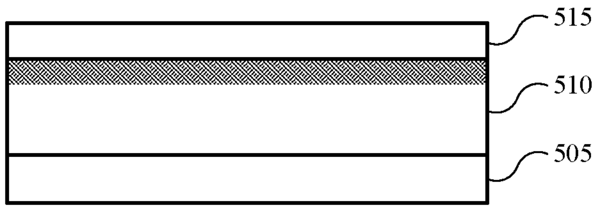

As shown in FIG. 5C, at operation 425, the method 400 may include forming a layer of a resist material 515 on the treated layer of silicon-containing material 510. The layer of resist material 515 may be formed using any material formation method, such as chemical vapor deposition, flowable chemical vapor deposition, plasma enhanced chemical vapor deposition, atomic layer deposition, or any other deposition method. The layer of resist material 515 may include a polymeric material. In embodiments, the polymeric material may include polymethyl methacrylate (PMMA), polystyrene and polystyrene derivatives, polystyrene-b-poly(methyl methacrylate) (PS-b-PMMA), polyhydroxystyren acrylic polymers, poly t-butyl acarylate, polyphenolic with different functional groups including dendrimers, calyx resorcinarene, truxenex, or calixarenes and 4-(methacryloyloxy)phenyl)-dimethylsulfoniumtriflate (MAPDST). The layer of resist material 515 may then be chemically treated to form a chemically amplified resist.

Figure 5D:
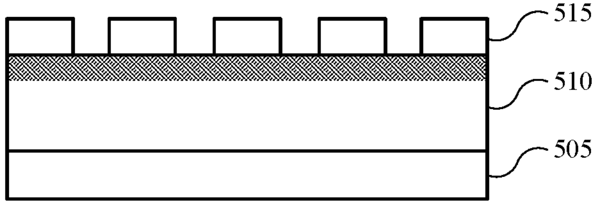

As shown in FIG. 5D, at optional operation 430, the method 400 may include patterning the layer of resist material 515. Any patterning operation, such as a lithography process, may be performed to produce a patterned layer of resist material 515 on the silicon-containing material 510. For example, a photolithography process may be used to selectively remove portions of the layer of resist material 515. Light, such as ultraviolet light, may be used to transfer a geometric pattern from a photomask or a reticle to the layer of resist material 515, which may be a light-sensitive chemical photoresist. Then, a series of chemical treatments may engrave the exposure pattern into the material underneath the photoresist. A patterned layer of resist material 515 may include features, such as resist lines or resist pillars. The features may be characterized by a critical dimension or pitch of less than or about 40 nm, and may be characterized by a critical dimension or pitch of less than or about 38 nm, less than or about 36 nm, less than or about 34 nm, less than or about 32 nm, less than or about 30 nm, less than or about 28 nm, less than or about 26 nm, less than or about 24 nm, less than or about 22 nm, less than or about 20 nm, less than or about 18 nm, less than or about 16 nm, less than or about 15 nm, less than or about 14 nm, less than or about 13 nm, or less.

In conventional technologies where a post-formation process, such as the process described as operation 415, is not performed, the patterned layer of resist material with a critical dimension or pitch of less than or about 40 nm may not be sufficiently adhered to the underlying layer of silicon-containing material. As such, the patterned layer of resist material may be prone to breaking, collapsing, flaking, or any other patterning defects. When the patterned layer of resist material includes a plurality of pillars, the pillars may release from the underlying layer of silicon-containing material and be missing from the structure entirely. However, the post-formation treatment at operation 415 of the present disclosure may modify the surface of the underlying layer of silicon-containing material 510 prior to contacting the treated layer of silicon-containing material 510 with the adhesion agent at operation 425. The post-formation treatment at operation 415 may weaken and/or destroy Si—OH bonds at the surface of the underlying layer of silicon-containing material 510, which may smooth the film and allow the surface to be more hydrophobic compared to conventional technologies after operation 425, thereby increasing adhesion with the patterned layer of resist material 515.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an adhesion agent" includes a plurality of such adhesion agents, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

forming a layer of silicon-containing material on a semiconductor substrate;

performing a post-formation treatment on the layer of silicon-containing material to yield a treated layer of silicon-containing material;

contacting the treated layer of silicon-containing material with an adhesion agent; and forming a layer of a resist material on the treated layer of silicon-containing material.

2. The semiconductor processing method of claim 1, wherein the layer of silicon-containing material comprises a silicon-containing anti-reflective coating, a spin-on glass, silicon oxynitride, or silicon carbonitride.

3. The semiconductor processing method of claim 2, wherein the spin-on glass comprises doped silicon dioxide, and wherein the doped silicon dioxide comprises boron or phosphorous.

4. The semiconductor processing method of claim 1, wherein:

a surface of the layer of silicon-containing material is hydrophilic prior to the post-formation treatment; and a surface of the treated layer of silicon-containing material is hydrophobic after contacting the treated layer of silicon-containing material with the adhesion agent.

5. The semiconductor processing method of claim 1, wherein a surface of the layer of silicon-containing material is characterized by Si—OH bonding prior to the post-formation treatment.

6. The semiconductor processing method of claim 1, wherein the post-formation treatment comprises an ion implantation process.

7. The semiconductor processing method of claim 6, wherein the ion implantation process is performed with ions of one or more elements from Group III through Group VIII.

8. The semiconductor processing method of claim 6, wherein the ion implantation process is performed with ions of fluorine or xenon.

9. A semiconductor processing method comprising:

forming a layer of silicon-containing material on a semiconductor substrate;

performing an ion implantation treatment on the layer of silicon-containing material to yield a treated layer of silicon-containing material;

contacting the treated layer of silicon-containing material with an adhesion agent; and forming a layer of resist material on the treated layer of silicon-containing material.

10. The semiconductor processing method of claim 9, wherein the adhesion agent comprises hexamethyldisilazane.

11. The semiconductor processing method of claim 9, wherein the ion implantation treatment comprises a beamline ion implantation process or a plasma doping process.

12. The semiconductor processing method of claim 9, wherein:

the ion implantation treatment comprises a beamline ion implantation process; and the beamline ion implantation process is performed at an energy of less than or equal to 2.5 keV.

13. The semiconductor processing method of claim 12, wherein an implant dose is characterized by 1 $e^{14}$ ions/$cm^2$ to 5 $e^{16}$ ions/$cm^2$.

14. The semiconductor processing method of claim 9, further comprising:

patterning the layer of resist material, wherein a patterned layer of resist material comprises resist lines characterized by a pitch of less than or equal to 40 nm.

15. A semiconductor processing method comprising:

forming a layer of silicon-containing material on a semiconductor substrate, wherein the layer of silicon-containing material comprises spin-on glass;

performing an ion implantation treatment on the layer of silicon-containing material to yield a treated layer of silicon-containing material;

contacting the treated layer of silicon-containing material with an adhesion agent, wherein the adhesion agent comprises a silazane group;

forming a layer of resist material on the treated layer of silicon-containing material; and patterning the layer of resist material.

16. The semiconductor processing method of claim 15, wherein the ion implantation treatment breaks Si—OH bonds present in the layer of silicon-containing material.

17. The semiconductor processing method of claim 15, wherein the adhesion agent comprises hexamethyldisilazane.

18. The semiconductor processing method of claim 15, wherein a surface of the treated layer of silicon-containing material is characterized by Si—O—$Si(CH_3)_3$ bonding after being contacted with the adhesion agent.

19. The semiconductor processing method of claim 15, wherein a surface of the treated layer of silicon-containing material is hydrophobic after being contacted with the adhesion agent.

20. The semiconductor processing method of claim 15, wherein patterning the layer of resist material forms resist lines characterized by a pitch of less than or equal to 40 nm, wherein the resist lines remain adhered to the treated layer of silicon-containing material.

* * * * *